United States Patent
Boyd, Jr. et al.

(10) Patent No.: US 10,847,402 B2
(45) Date of Patent: Nov. 24, 2020

(54) BOND PROTECTION AROUND POROUS PLUGS

(71) Applicant: Applied Materials, Inc., Santa Clara, CA (US)

(72) Inventors: Wendell Glenn Boyd, Jr., Morgan Hill, CA (US); Sumanth Banda, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 319 days.

(21) Appl. No.: 15/943,285

(22) Filed: Apr. 2, 2018

(65) Prior Publication Data
US 2019/0304827 A1     Oct. 3, 2019

(51) Int. Cl.
*H01L 21/683* (2006.01)
*C04B 37/02* (2006.01)

(52) U.S. Cl.
CPC ........ *H01L 21/6833* (2013.01); *C04B 37/026* (2013.01); *C04B 2237/121* (2013.01); *C04B 2237/402* (2013.01)

(58) Field of Classification Search
CPC ........... H01L 21/6833; H01L 21/68757; H01L 21/67103; H01L 21/68785; H01L 21/6831; C04B 37/026; C04B 2237/402; C04B 2237/121
USPC ........................................................ 361/234
See application file for complete search history.

(56) References Cited

U.S. PATENT DOCUMENTS

| | | | |
|---|---|---|---|
| 6,490,144 B1 | 12/2002 | Narendrnath et al. | |
| 8,449,786 B2 | 5/2013 | Larson et al. | |
| 9,627,240 B2 | 4/2017 | Yamaguchi et al. | |
| 9,685,356 B2 | 6/2017 | Parkhe et al. | |
| 9,960,067 B2 | 5/2018 | Anada et al. | |
| 10,688,750 B2 | 6/2020 | Parkhe et al. | |
| 2010/0156054 A1 | 6/2010 | Sun et al. | |
| 2011/0272899 A1 | 11/2011 | Shimazu | |
| 2013/0088808 A1 | 4/2013 | Parkhe | |
| 2014/0376148 A1 | 12/2014 | Sasaki et al. | |
| 2016/0276196 A1 | 9/2016 | Parkhe | |
| 2016/0352260 A1 | 12/2016 | Comendant | |
| 2017/0243726 A1 | 8/2017 | Kellogg | |
| 2017/0256431 A1* | 9/2017 | Parkhe | H01L 21/6875 |
| 2018/0025933 A1* | 1/2018 | Ishimura | H01L 21/67103 269/8 |
| 2018/0090361 A1 | 3/2018 | Sasaki et al. | |
| 2019/0267277 A1 | 8/2019 | Sasaki et al. | |

FOREIGN PATENT DOCUMENTS

JP          6110159 B2     4/2017

OTHER PUBLICATIONS

International Search Report and Written Opinion for Application No. PCT/US2019/018589 dated May 31, 2019.

* cited by examiner

*Primary Examiner* — Dharti H Patel
(74) *Attorney, Agent, or Firm* — Patterson + Sheridan, LLP

(57) ABSTRACT

A method and structure for a bonding layer are disclosed. The bonding structure includes a first portion surrounding an opening in a body defining a dam thereabout. A second portion surrounds the first portion. The first portion is formed from a material resistant to degradation from exposure to a process gas. The second portion is formed from a different material than the material of the first portion. The first portion further includes one or more additives to change properties thereof.

18 Claims, 4 Drawing Sheets

BOND PROTECTION AROUND POROUS PLUGS

BACKGROUND

Field

Embodiments of the present disclosure generally relate to a bonding layer for an electrostatic chuck.

Description of the Related Art

Electrostatic chucks are utilized in a variety of manufacturing and processing operations. In semiconductor manufacturing, electrostatic chucks are commonly used to support a substrate in a processing chamber. Semiconductor manufacturing exposes the substrate support, which contains the electrostatic chuck, to the processing chamber environment and a range of temperatures between ambient and substrate process temperatures. In order to maintain the temperature of the substrate at a desired setpoint, the electrostatic chuck, which is generally formed from a ceramic, is coupled to a temperature control base. A conductive bonding material between the electrostatic chuck portion and the temperature control base to form a connection therebetween.

The substrate support, including the bonding material exposed at the interface between the electrostatic chuck and the cooling base at any backside gas passages extending therethrough, is exposed to the process gases and process reaction byproducts of the manufacturing process performed within the processing chamber. Some of these gases and byproducts, when coming into contact with the bonding material, can deteriorate and erode the bonding material. Inconsistencies in the bonding material also result during the fabrication and forming thereof. These variations, such as variances in adhesion strength and material properties, can result in delamination of the bonding material from the electrostatic chuck and the temperature control base. Additionally or alternatively, such variations may locally change the heat transfer through the bonding material, resulting in temperature variations across the chucking surface of the electrostatic chuck. Further, the electrostatic chuck and the temperature control base may have different coefficients of thermal expansion. When the temperature of the substrate support increases, such as during process operations, or when the electrostatic chuck and the temperature control base have different temperatures, the stress in the bonding material increases due to the differing thermal expansions of the electrostatic chuck and the temperature control base. The increase of stress can result in localized delamination of the bonding material when local stresses exceed the bonding strength.

In a conventional method, process gas resistant seals, such as O-rings, are installed around openings in the substrate support in order to isolate the bonding layer from the process gases. However, O-rings require compression between two bodies, such as the electrostatic chuck and the temperature control base, in order to isolate the bonding material. The compression of the O-rings results in localized stresses in the bonding material around the O-ring which result can result in delamination of the bonding layer and/or inadequate adhesion between the electrostatic chuck and the temperature control base.

Therefore, there is a need for improved methods of protecting bonding layers.

SUMMARY

The present disclosure generally relates to a bonding layer for an electrostatic chuck.

In one embodiment, a bonding layer structure has a first body having an opening therethrough and a second body with an opening aligned with the opening of the first body. A bonding layer is disposed between the first body and the second body. The bonding layer has a first portion formed from a cross-linked polymer defining a dam around a periphery of the opening of the first body. The bonding layer has a second portion disposed surrounding the first portion. A seal is disposed surrounding the first portion and the second portion, wherein the seal is positioned between the first body and the second body.

In another embodiment, a substrate support has a dielectric body having one or more openings therethrough and a temperature control base coupled thereto. The temperature control base has one or more openings therethrough which are aligned with the one or more openings of the dielectric body. An electrode is disposed in the dielectric body. A bonding layer disposed between the dielectric body and the temperature control base. The bonding layer has one or more first portions formed from a cross-linked polymer defining a dam around a periphery of each of the openings of the dielectric body, a second portion disposed surrounding the one or more first portions, and a seal disposed surrounding the one or more first portions and the second portion, wherein the seal is positioned between the dielectric body and the temperature control base.

In yet another embodiment, a method of forming a bonding layer includes forming a first material, depositing the first material to form a dam around an opening formed in a body, depositing a second material around the deposited first material, and curing the first material and the second material to form a bond. The first material is resistant to degradation from exposure to a process gas. The second material is a different material than the first material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a method of forming and a structure of a bonding layer. The bonding structure includes a first portion surrounding an opening in a body defining a dam thereabout. A second portion surrounds the first portion. The first portion is formed from a material resistant to degradation from exposure to a process gas. The second portion is formed from a different material than the material of the first portion. The first portion further includes one or more additives to change properties thereof.

Figure 1A:
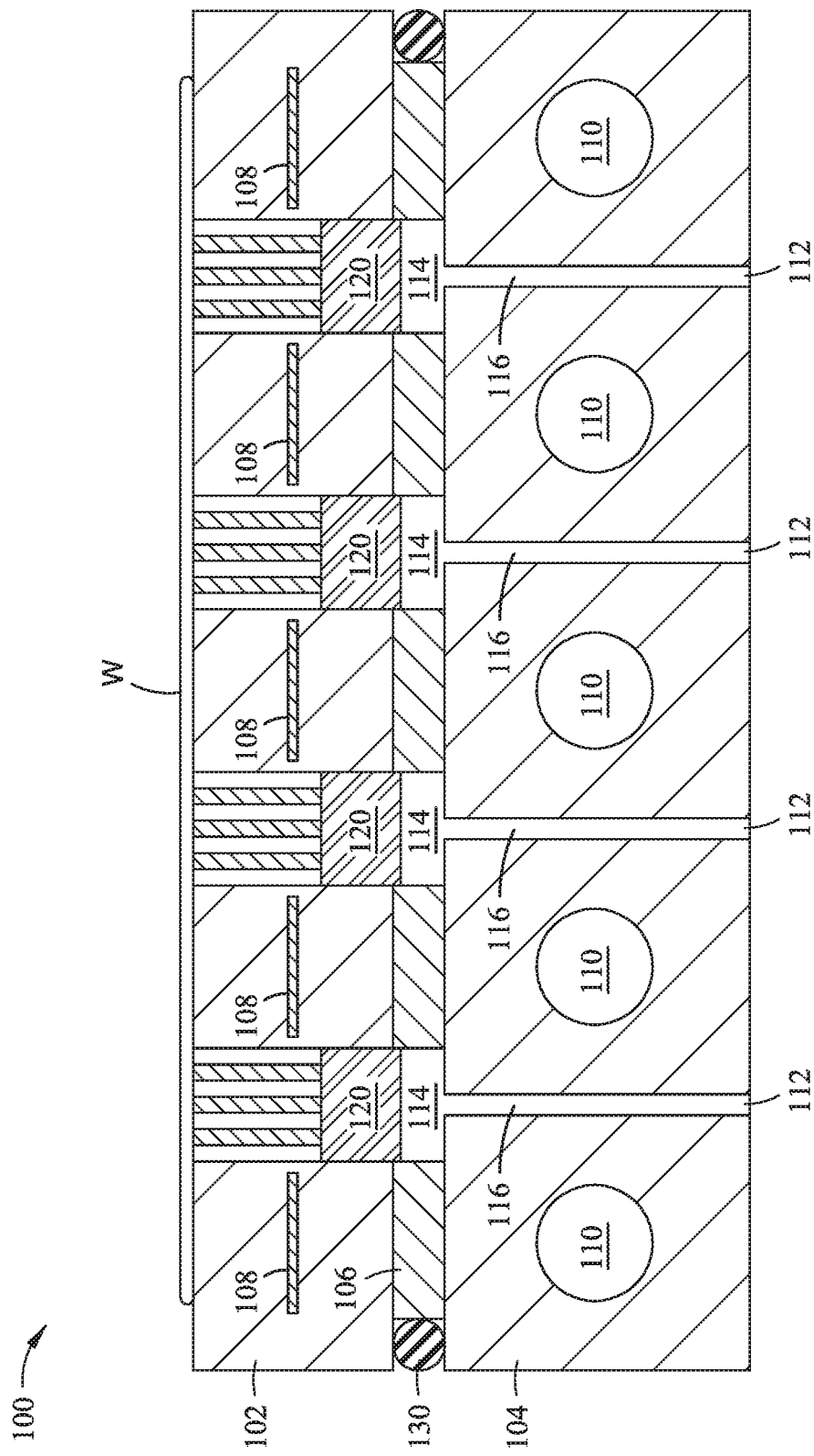
FIG. 1A is a schematic cross-sectional view of an exemplary substrate support according to one embodiment.

FIG. 1A is a schematic cross-sectional view of an exemplary substrate support 100 for use in a processing chamber. The substrate support 100 has a dielectric body 102, which partially defines the electrostatic chuck, and a temperature control base 104. The dielectric body 102 is formed of a ceramic, such as alumina or aluminum nitride. The temperature control base 104 is formed of a metal such as aluminum. The temperature control base 104 is fixed to a cylindrical support post (not shown) which extends through a wall of a processing chamber to support the substrate support 100 thereon. The substrate support 100 may generally have a circular shape but other shapes, such as rectangular or ovoid, capable of supporting a substrate W may be utilized.

The dielectric body 102 includes an upper surface for supporting the substrate W thereon. Electrodes 108 are disposed within the dielectric body 102. The electrodes 108 are connected to a power source (not shown) which imposes a voltage on the electrodes 108 to form an electromagnetic field at the interface of the upper surface of the dielectric body 102 and the substrate W. The electromagnetic field interacts with the substrate W to chuck the substrate W to the surface of the dielectric body 102. The electrodes 108 may be biased to provide either a monopolar or a bipolar chuck.

The temperature control base 104 includes channels 110 disposed therein to circulate a fluid through the temperature control base 104. The fluid, typically a liquid such as GALDEN®, flows from a temperature control unit (not shown) through the channels 110 and back to the temperature control unit. In certain processes, the fluid is used to cool the temperature control base 104 in order to lower the temperature of the dielectric body 102 and substrate W disposed thereon. Conversely, the fluid may be used to elevate temperature of the temperature control base 104 to heat the dielectric body 102 and substrate W thereon. In other embodiments, resistive heaters (not shown) may be disposed within the temperature control base 104. In some cases, heat from the resistive heaters, in combination with heat transfer from the temperature control base 104 into the fluid, is used to maintain the dielectric body 102 or the substrate W at a setpoint temperature.

A bonding layer 106 is disposed between a lower surface of the dielectric body 102 and an upper surface of the temperature control base which faces the dielectric body 102. The upper surface of the temperature control base 104 is opposite the lower surface of the temperature control base 104 which is coupled to the cylindrical support post. The bonding layer 106 secures, and thermally couples, the dielectric body 102 to the temperature control base 104.

Flow apertures 112 are disposed within the substrate support 100. As shown in FIG. 1A, the flow apertures 112 extend from a lower surface of the temperature control base 104 to an upper surface of the dielectric body 102. Each flow aperture 112 includes a first opening 114 formed through the dielectric body 102 and the bonding layer 106, and a second opening 116 is formed through the temperature control base 104. The second opening 116 is concentrically aligned with, and opens into, the first opening 114. In this configuration, when gas is introduced into the flow apertures 112, the gas is allowed to flow to a region between a lower surface of substrate W adjacent the dielectric body 102 and the upper (e.g., support) surface of the dielectric body 102. One or more channels (not shown) may be formed on the upper surface of the dielectric body 102, orthogonal to the second openings 116, to facilitate gas flow adjacent the surface of the substrate W. The gas is maintained at a pressure sufficient to cause the gas to function as a heat conduction path between the substrate W and the dielectric body 102.

Figure 1B:
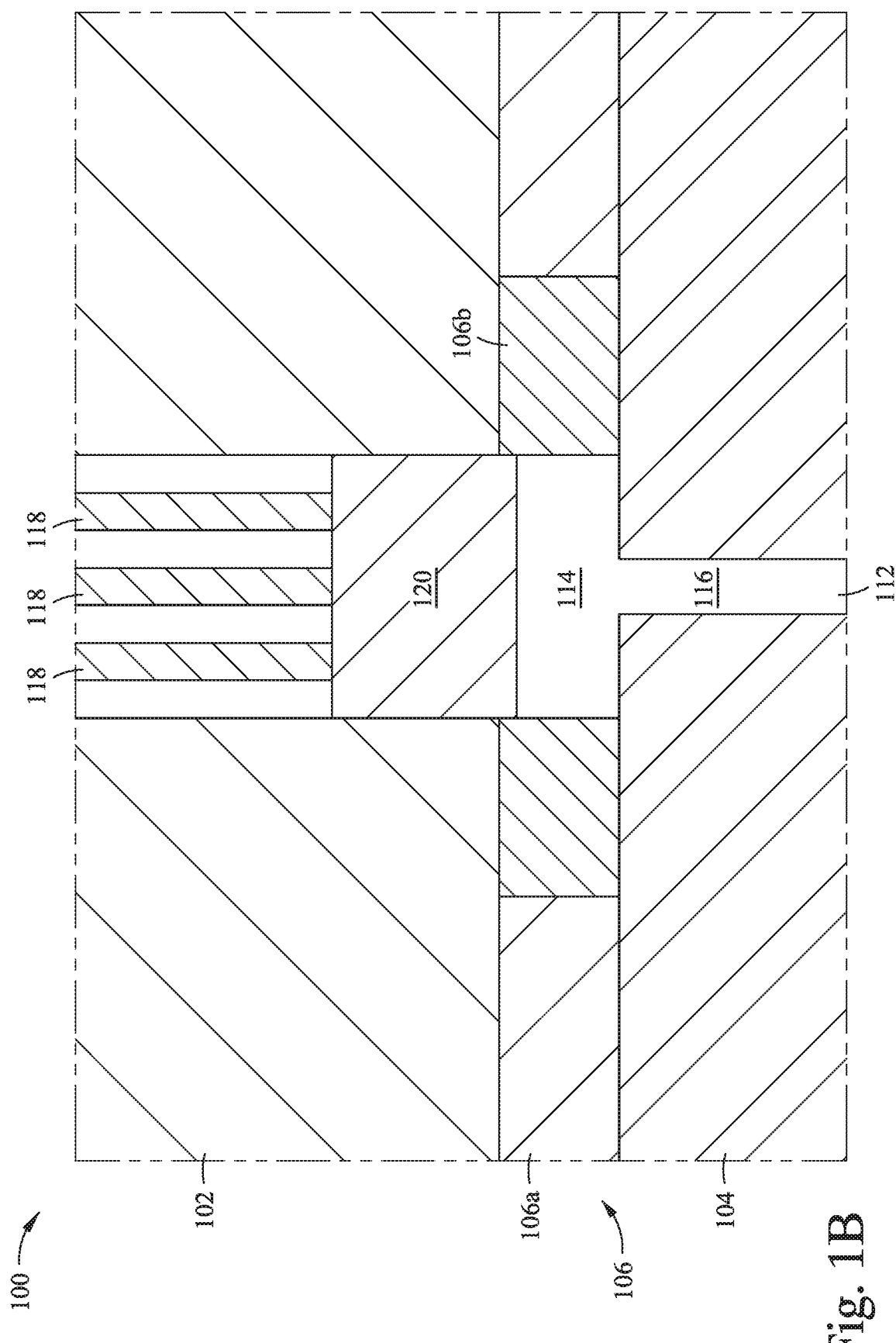
FIG. 1B is an enlarged portion of the substrate support of FIG. 1A.

A plurality of vanes 118 are formed within the dielectric body 102. The vanes 118 are configured to align with the openings 114, 116 and partially define the flow aperture 112. While three vanes 118, defining, in combination with the adjacent sidewall of the opening 114 in the dielectric body 102, four passages, are shown in FIGS. 1A and 1B, it is contemplated that any applicable number of vanes 118 may be utilized. A gas source (not shown) is fluidly coupled to the flow apertures 112. During processing, a gas such as helium flows from the gas source and is delivered to the lower surface of substrate W (i.e., the surface not exposed to the processing area of the chamber) via the flow apertures 112.

During processing, some gases are known to degrade the boding layer 106 that is exposed to the gas at the flow apertures 112 and/or exposed portions at the periphery of the substrate support 100. In order to isolate the bonding layer 106 from the process gases, a seal 130 is disposed around the periphery thereof. The seal 130 is, for example, an O-ring formed from a material resistant to degradation from exposure to the process gases. In this example, the O-ring contacts, and is compressed between, the temperature control base and the dielectric body which prevents flow of a process gas thereby isolating the bonding layer 106.

A plug 120 is optionally disposed within the dielectric body 102 in the first opening 114 of the flow aperture 112. The plug 120 is formed from a porous material such as a ceramic which may be alumina or zirconia. The plug 120 has a porosity, such as a range of porosity between 10% and 80%, for example about 20% to about 60%, such as 40%, which allows the passage of the gas from an area of the first opening 114 proximate to the second opening 116, through the porous plug 120, to the passages between the vanes 118 and fluidly communicate with the region between the substrate W when supported on the dielectric body 102, and the dielectric body 102. The plug 120 further prevents ionized particles or ionized gas from passing from the processing area, through the passages between the vanes 118, and into the isolated portion of the volume defined by openings 114, 116 when the substrate W is not disposed on the dielectric body 102.

FIG. 1B is an enlarged portion of the substrate support 100 of FIG. 1A. Here, the bonding layer 106 is formed from two portions 106a, 106b. The portion 106b functions as a protective seal to isolate the portion 106a from process gases flowing into the flow aperture 112. The portion 106b is alternatively referred to herein as a dam. In one embodiment, the portion 106a and the portion 106b are formed from different materials. For example, the portion 106a may be formed from a thermally conductive bonding material such as silicone, acrylic, or perfluoropolymer, among others, which may be subject to degradation from exposure to the process gases flowing through the flow aperture 112. On the other hand, the portion 106b is formed from a material resistant to degradation from exposure the process gases. For example, the portion 106b may be formed from cross-linked polyethylene (XPE). In some cases, properties, such as viscosity, thermal conductivity, and thermal expansion, among others, of the material used for portion 106b are adjusted to be similar or substantially identical to those of the material used for portion 106a. In order to achieve the desired properties, the portion 106b is formed with additives in the material. The additives may include, for example, materials that facilitate adjustment of the thermal expansion and thermal conductivity of the seal portion 106b without reducing resistance of the material to degradation from exposure to the process gases. Exemplary additives include aluminum oxide, yttrium oxide, zirconium oxide, other metallic oxides, and/or ceramic powders, among others. Use of the additives in the bonding material allows the portion 106b to isolate and protect the portion 106a from deterioration due to exposure to process gases while providing uniform heat transfer and thermal expansion across the bonding layer 106.

Conventional methods of forming bonding layers using pastes of the bonding material include forming dams around openings in the substrate support in order to prevent flow of the bonding paste into the opening. In some cases, the dams are formed of the same material as the bonding layer to provide uniform heat transfer across the chucking surface of the electrostatic chuck. However, these materials can be subject to deterioration due to exposure to the process gases. In other cases, the dams are formed from a material resistant to the process gases. These materials, however, cause local variances in heat transfer between the electrostatic chuck and the temperature control base due to the differences in heat transfer properties in the dam materials and the bonding materials.

Figure 2:
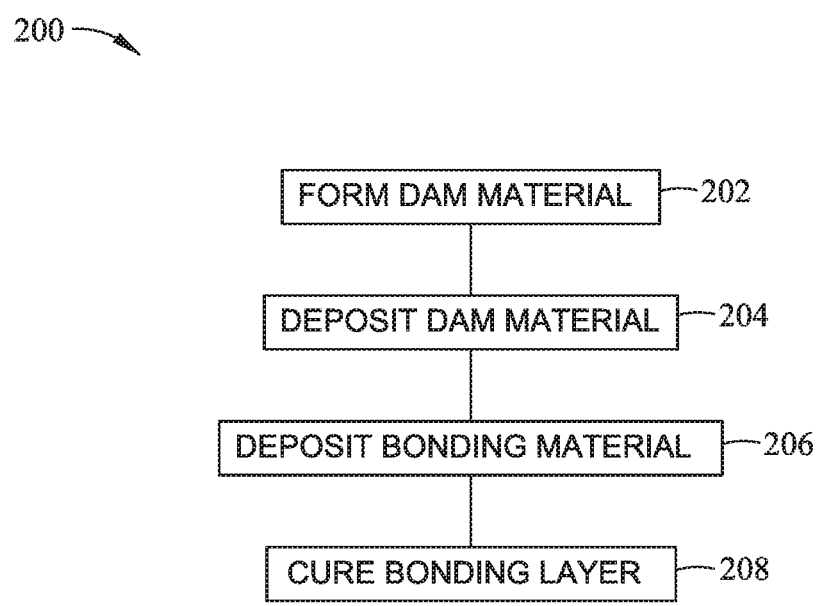
FIG. 2 is a flowchart of an exemplary method of forming a bonding layer according to one embodiment.

FIG. 2 is a flowchart of an exemplary method 200 of forming a bonding layer, such as the bonding layer 106. In the method 200, the material for the dam is formed at 202. In one example, the dam material is XPE formed in a batch mixing process. Additives are introduced to the batch in order to distribute the additives throughout the XPE material. The additives, and quantities thereof, are selected to achieve desired material properties for the forming and function of the dam. Alternatively, the dam material can be premixed.

At 204, the dam is then formed. Exemplary methods of forming the dam include extrusion and screen printing but other methods may be used. The dam material is deposited onto a desired area, such as a surface of the dielectric body 102 or the temperature control base 104 around the opening 114. After deposition, the dam material is optionally cured, such as by thermal curing, UV curing, air drying, among others, either partially or fully, in order to prevent dislocation or shifting of the dam material during subsequent operations. The dam material may be cured at a temperature of about 150 degrees Centigrade or less.

Next at 206, the bonding material is deposited, such as by extrusion or screen printing, among others, onto the surface proximate the dam material. The bonding material is, for example, paste bonding material or sheets of bonding material. The dam prevents flow of the bonding material into undesired areas, such as opening 114, when depositing the bonding material and/or curing of the bonding layer.

Then at 208, the bodies to be bonded (i.e., dielectric body 102 and temperature control base 104) are disposed in contact with the deposited bonding material and dam material. The deposited bonding material and dam material are cured to form the bonding layer and create a bond between the bodies. In one embodiment, the bonding material and the dam material are cured at an anticipated operation temperature of the bonding layer. The formed dam prevents flow of the bonding material into undesired areas during curing thereof.

Figure 3:
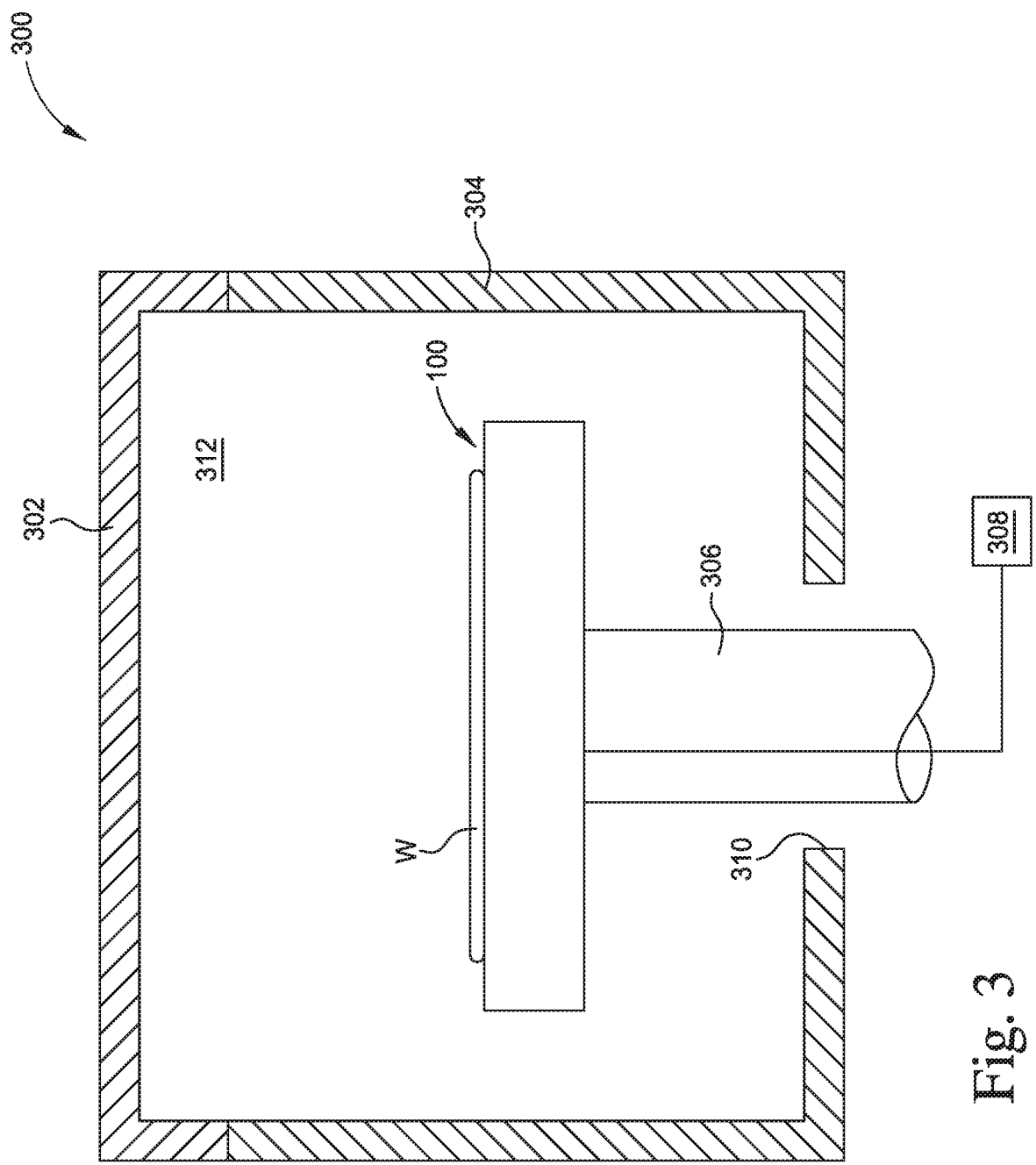
FIG. 3 is an exemplary processing chamber having a substrate support.

FIG. 3 is an exemplary processing chamber 300 having the substrate support 100 therein. The processing chamber 300 includes a chamber body 304 with a lid 302 coupled thereto defining a processing volume 312. A process gas entrance port (not shown) may be formed though the lid for providing a process gas into an interior of the body 102. A shaft 306 extends into the processing volume 312 through an opening 310 in a lower portion of the chamber body 304. The shaft 306 is coupled to and supports the substrate support 100. A substrate W is shown disposed on the substrate support 100. A gas source 308 is coupled to the substrate support 100 through the shaft 306 and is configured to deliver gas, such as helium, to the flow apertures 112 (FIGS. 1A & 1B) as discussed above. Here, the processing chamber 300 is an exemplary chamber. The substrate support 100 may be used with other suitable chambers. Suitable processing chambers include those manufactured by Applied Materials, Inc., of Santa Clara, Calif. However, other processing chambers, including those from other manufacturers, are contemplated. Such processing chambers may include, for example, etch chambers as well as deposition chambers.

Benefits of the disclosure herein provide a process resistant seal around an opening formed in a substrate support. The disclosed embodiments isolate a bonding material from exposure to a process gas while providing increased uniformity of properties across the bonding layer. Further, while the embodiments herein refer to an electrostatic chuck, such embodiments are non-limiting, as other types of substrate supports may benefit from aspects of the disclosure.

While the foregoing is directed to embodiments of the present disclosure, other and further embodiments of the disclosure may be devised without departing from the basic scope thereof, and the scope thereof is determined by the claims that follow.

What is claimed is:

1. A bonding layer structure, comprising:
    a first body having an opening therethrough;
    a second body having an opening therethrough, wherein the opening of the first body is aligned with the opening of the second body, the opening of the first body having a larger diameter than the opening of the second body; and
    a bonding layer disposed between the first body and the second body, the bonding layer comprising:
        a first portion formed from a cross-linked polymer defining a dam around a periphery of the opening of the first body, the first portion contacting a porous plug disposed in the first opening, a bottom surface of the porous plug disposed between the first body and the second body;
        a second portion disposed surrounding the first portion; and
        a seal disposed surrounding the first portion and the second portion, wherein the seal is positioned between the first body and the second body.

2. The bonding structure of claim 1, wherein the first body comprises a ceramic.

3. The bonding structure of claim 1, wherein the second body comprises a metal.

4. The bonding structure of claim 1, wherein the first portion of the bonding layer further comprises one or more additives selected from aluminum oxide, yttrium oxide, zirconium oxide, and ceramic powders.

5. The bonding structure of claim 1, wherein the second portion of the bonding layer is formed from silicone, acrylic, or perfluoropolymer.

6. A substrate support, comprising:
    a dielectric body having one or more openings therethrough;

a temperature control base coupled to the dielectric body, wherein the temperature control base has one or more openings therethrough aligned with the one or more openings in the dielectric body, wherein the one or more openings in the dieletric body have a larger diameter than the one or more openings in the thermal control base;

an electrode disposed in the dielectric body; and a bonding layer disposed between the dielectric body and the temperature control base, the bonding layer comprising:

one or more first portions formed from a cross-linked polymer defining a dam around a periphery of each of the openings of the dielectric body, each of the one or more first portions contacting a porous plug disposed in each of the openings in the dielectric body, a bottom surface of each porous plug disposed between the dielectric body and the temperature control base;

a second portion disposed surrounding the one or more first portions; and a seal disposed surrounding the one or more first portions and the second portion, wherein the seal is positioned between the dielectric body and the temperature control base.

7. The substrate support of claim 6, wherein the dielectric body comprises a ceramic.

8. The substrate support of claim 6, wherein the temperature control base comprises a metal.

9. The substrate support of claim 6, wherein the one or more first portions of the bonding layer further comprise one or more additives selected from aluminum oxide, yttrium oxide, zirconium oxide, and ceramic powders.

10. The substrate support of claim 9, wherein the first portion has a thermal conductivity about equal to the thermal conductivity of the second portion.

11. The substrate support of claim 6, wherein the second portion of the bonding layer is formed from silicone, acrylic, or perfluoropolymer.

12. A method of forming a bonding layer, comprising:

forming a first material, wherein the first material is resistant to degradation from exposure to a process gas;

depositing the first material to form a dam around an opening formed in a body;

depositing a second material around the deposited first material, wherein the second material is a different material than the first material; and curing the first material and the second material to form a bond.

13. The method of claim 12, wherein forming the dam further comprises:

partially curing the first material.

14. The method of claim 12, wherein the second material is silicone, acrylic, or perfluoropolymer.

15. The method of claim 12, wherein the first material is a cross-linked polymer.

16. The method of claim 15, wherein the first material further comprises one or more additives selected from aluminum oxide, yttrium oxide, zirconium oxide, and ceramic powders.

17. The method of claim 16, wherein the first material has a thermal conductivity about equal to the thermal conductivity of the second material.

18. The method of claim 15, wherein the first material is mixed in a batch process.

* * * * *